United States Patent
Bendikas et al.

(10) Patent No.: US 6,307,750 B1
(45) Date of Patent: *Oct. 23, 2001

(54) INTERFACE PANEL APPARATUS AND METHOD

(75) Inventors: Laura M. Bendikas, Chicago; Joseph Digiacomo, Burbank, both of IL (US)

(73) Assignee: 3Com Corporation, Rolling Meadows, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,776

(22) Filed: Nov. 22, 1999

(51) Int. Cl.[7] .............................. H05K 7/02; H05K 7/14; H05K 7/18; G06F 1/16
(52) U.S. Cl. ..................... 361/725; 361/724; 361/730; 361/731; 361/752
(58) Field of Search .................................... 361/679, 724, 361/725, 726, 727, 730, 731, 683, 686, 729, 728, 735, 752; 439/49, 540.1; H05K 7/00, 7/02, 7/10, 7/14, 7/18; G06F 1/16

(56) References Cited

U.S. PATENT DOCUMENTS

| | | | |
|---|---|---|---|
| 4,636,726 | * | 1/1987 | Santomango et al. ............ 324/158 F |
| 4,773,867 | * | 9/1988 | Keller et al. ............................ 439/49 |
| 5,167,530 | * | 12/1992 | Wallgren et al. ..................... 439/540 |
| 5,548,489 | * | 8/1996 | Reed et al. ............................ 361/827 |
| 5,658,166 | * | 8/1997 | Freeman et al. .................. 439/540.1 |
| 5,801,921 | * | 9/1998 | Miller .................................... 361/686 |
| 5,931,703 | * | 8/1999 | Aekins ................................. 439/676 |
| 5,944,535 | * | 8/1999 | Bullivant et al. ....................... 439/49 |

\* cited by examiner

Primary Examiner—Leo P. Picard
Assistant Examiner—Anatoly Vortman
(74) Attorney, Agent, or Firm—Baniak Pine & Gannon

(57) ABSTRACT

An interface panel for providing telecommunication signals to a plurality of electronic modules housed within an electronics cabinet is provided. A bracket member includes a plurality of openings. A plurality of connectors for receiving a plurality of input cables is positioned within the plurality of openings and is mounted to the bracket. Each of the plurality of connectors includes at least fifteen conductive pins. A plurality of output cables operatively coupled to each of the plurality of connectors is also provided. Each of the plurality of output cables is operatively coupled to a predetermined set of the at least fifteen conductive pins. Each of the plurality of output cables includes an adapter for connection to one of the plurality of electronic modules.

23 Claims, 3 Drawing Sheets

US 6,307,750 B1

INTERFACE PANEL APPARATUS AND METHOD

FIELD OF THE INVENTION

This invention relates generally to the field of interface panels, and in particular, to an interface panel for providing telecommunication signals to a plurality of electronic modules housed within an electronics cabinet.

BACKGROUND OF THE INVENTION

Conventional electronic modules for high-speed telecommunication and networking applications are typically housed in a cabinet that is specifically designed to house such electronic modules. Typically, a vertically oriented rack is positioned within the cabinet, and the electronic modules are fastened to the rack. The electronic modules are stacked one on top of the other in a vertically stacked configuration.

Telecommunication signals must be routed to and from the plurality of electronic modules within the cabinet. This is typically accomplished by providing a communications panel mounted to the rack within the cabinet. The communications panel is typically mounted adjacent the backside of the cabinet to allow a technician to access the panel. One side (i.e. the front side) of the communications panel typically includes 176 standard RJ48 connectors. In particular, the RJ48 connectors are mounted to the communications panel so that the connectors face outward toward the backside of the cabinet. The technician may then access the backside of the cabinet and rout up to 176 input cables to the connectors on the communications panel. The 176 input cables are typically routed into the cabinet from the top or bottom of the cabinet.

Output cables are typically positioned on the other side of the communications panel, and one end of each of the output cables is typically hardwire to the RJ48 connectors mounted to the panel. The other end of each of the output cables typically includes a RJ48 connector that is configured to mate with any one of the socket connectors mounted within the electronic modules.

There are several disadvantages with these conventional communications panels. First, the size of conventional communications panels is large due to the large number of RJ48 connectors (typically 176 RJ connectors) that are required to provide telecommunications signals to the plurality of electronic modules within the cabinet. These cabinets typically have strict dimensional requirements, and the large size of conventional communications panels greatly reduces the amount space in the cabinet that could otherwise be used for other various electronic functions. Moreover, routing 176 individual cables into the cabinet also requires a large amount of physical space, and may block the required airflow through the cabinet, which may result in the overheating of the various electronic modules within the cabinet.

In addition, a technician must rout and connect 176 input cables to the 176 connectors on the communications panel. The large number of connections increases the installation time, and also increases the chance that the input cables will not be routed properly. Finally, the large number of input cables and connectors on the communications panel greatly increases the time required to debug the system in the event there is a failure in one or more of the connections.

Accordingly, it would be desirable to have an interface panel for providing telecommunication signals to a plurality of electronic modules housed within an electronics cabinet that overcomes the disadvantages described above.

SUMMARY OF THE INVENTION

One aspect of the invention provides an interface panel for providing telecommunication signals to a plurality of electronic modules housed within an electronics cabinet. A bracket member includes a plurality of openings. A plurality of connectors for receiving a plurality of input cables is positioned within the plurality of openings and is mounted to the bracket. Each of the plurality of connectors includes at least fifteen conductive pins. A plurality of output cables operatively coupled to each of the plurality of connectors is also provided. The plurality of output cables may preferably be comprised of eleven output cables. Each of the plurality of output cables is operatively coupled to a predetermined set of the at least fifteen conductive pins. Each of the plurality of output cables further includes an adapter for connection to one of the plurality of electronic modules. The at least fifteen conductive pins may preferably be comprised of sixty-four conductive pins. The adapter may preferably be a RJ48 adapter. The bracket member may preferably be a planar member, and may be comprised of a conductive material. Each of the plurality of output cables may preferably be hardwired to each of the plurality of connectors. Each of the plurality of output cables may preferably be hardwired to the predetermined set of the at least fifteen conductive pins. The predetermined set of the plurality of the at least fifteen conductive pins may preferably be comprised of at least four conductive pins. The plurality of output cables operatively coupled to one of the plurality of connectors may preferably be bundled together. The plurality of openings may preferably be comprised of sixteen openings, and the plurality of connectors may preferably be comprised of sixteen connectors.

Another aspect of the invention provides a system for providing telecommunications signals to a plurality of electronic modules housed in an electronics cabinet. A plurality of electronic modules is positioned within an electronics cabinet. An interface panel including a bracket member is mounted within the cabinet. The bracket member includes a plurality of openings. A plurality of connectors for receiving a plurality of input cables is positioned within the plurality of openings and is mounted to the bracket. Each of the plurality of connectors includes at least fifteen conductive pins. A plurality of output cables is operatively coupled to each of the plurality of connectors. Each of the plurality of output cables is operatively coupled to a predetermined set of the at least fifteen conductive pins. Each of the plurality of output cables includes an adapter for connection to one of the plurality of electronic modules. The at least fifteen conductive pins may preferably be comprised of sixty-four conductive pins. The adapter may preferably be a RJ48 adapter. A vertically oriented rack may preferably be housed within the cabinet, and each of the plurality electronic modules may preferably be fastened to the rack. The bracket member of the interface panel may preferably be fastened to the rack adjacent a back portion of the electronics cabinet. Each of the plurality of input cables may preferably include an input connector adapted to mate with the plurality of connectors. Each of the plurality of electronic modules may preferably include at least one socket adapted to receive the adapter.

Another aspect of the invention provides a method of providing telecommunication signals to a plurality of electronic modules housed within an electronics cabinet. A bracket member including a plurality of openings is provided. A plurality of connectors is also provided. Each of the plurality of connectors includes at least fifteen conductive pins. A plurality of output cables is also provided. Each of the plurality of cables includes an adapter. The plurality of connectors is positioned within the plurality of openings and is mounted to the bracket. Each of the plurality of output cables is operatively coupled to a predetermined set of the at least fifteen conductive pins. The at least fifteen conductive pins may preferably be comprised of sixty-four conductive pins. A plurality of input cables may preferably be provided. Each of the plurality of input cables may preferably include an input connector adapted to mate with one of the plurality of connectors, and the plurality of input cables may preferably be connected to the plurality of connectors. Each of the plurality of electronic modules may preferably include at least one socket adapted to receive the adapter, and the adapter may preferably be inserted into the at least one socket of one of the plurality of electronic modules.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
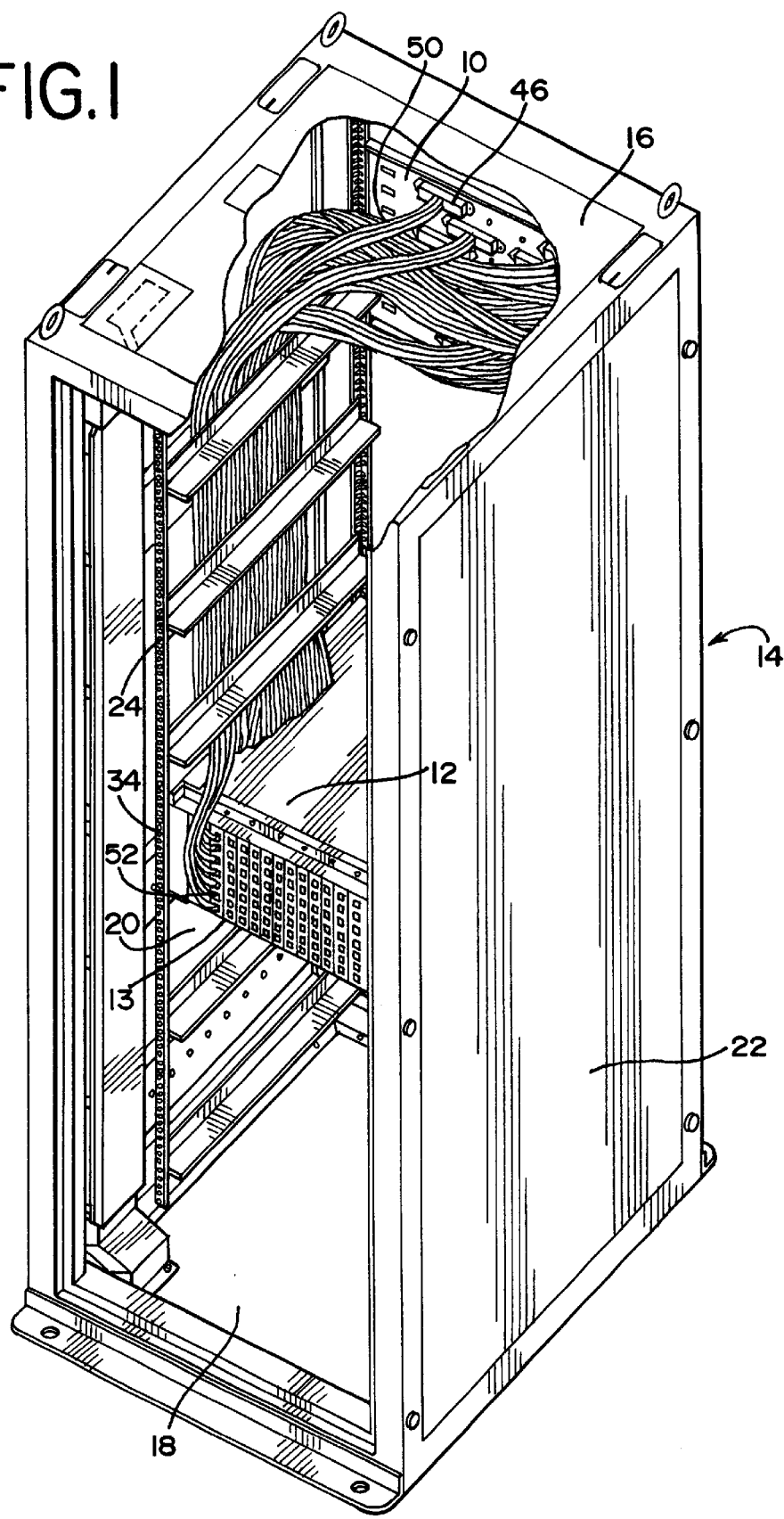
FIG. 1 is a perspective view of a preferred embodiment of an interface panel that is made in accordance with the invention shown mounted to an electronics cabinet.
Figure 3:
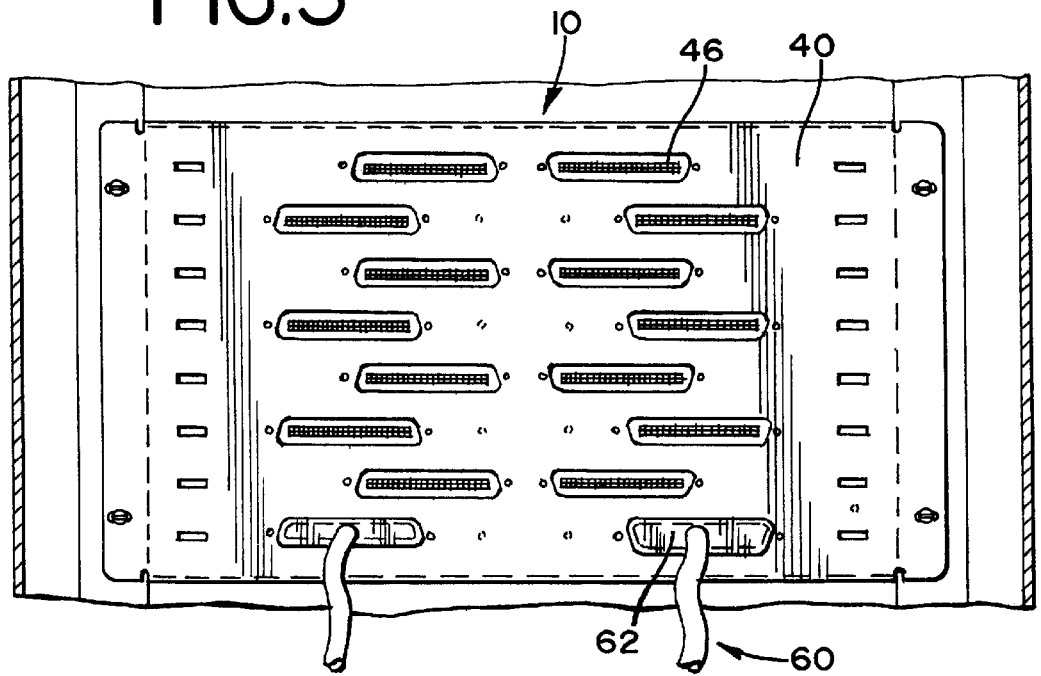
FIG. 3 back view of the interface panel of FIG. 1 mounted to an electronics cabinet.
Figure 4:
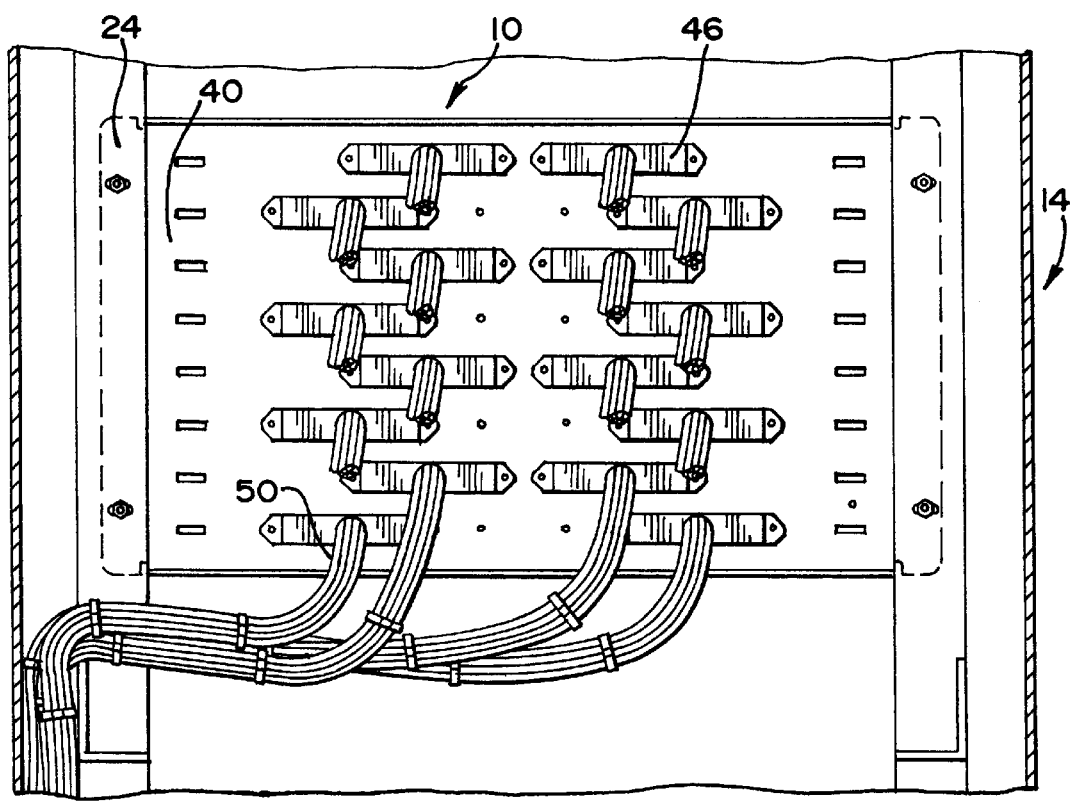
FIG. 4 is a front view of the interface panel of FIG. 1 mounted to an electronics cabinet.

A preferred embodiment of an interface panel 10 is shown in FIGS. 1 and 3–4. As shown in FIG. 1, the interface panel 10 provides telecommunication signals to a plurality of electronic modules 12 housed within an electronics cabinet 14. The electronics cabinet 14 may preferably be any conventional cabinet for housing the plurality of electronic modules 12. For example, the electronics cabinet 14 may preferably be adapted to house various electronic modules 12 used to carry out various networking applications. As shown in FIG. 1, the electronics cabinet 14 may preferably be rectangular in shape, and may preferably include a top wall 16, a bottom wall 18, a first sidewall 20 and a second sidewall 22.

Referring to FIG. 1, a vertically oriented rack 24 may preferably be positioned within the electronics cabinet 14. The rack 24 may preferably include four vertically oriented support members that are supported by a number of cross members. The rack 24 may preferably include a plurality of equally spaced openings 34 to allow the plurality of electronic modules 12 to be fastened to the rack 24.

The electronic modules 12 may preferably include a wide variety of electronic devices for high-speed telecommunication and networking applications. For example, the electronic modules 12 may preferably include, for example, an office router, a port expansion device, a managed modem pool device, an access concentrator, a redundant power device, a LAN switch, an edgeserver, and other various types of conventional electronic devices.

Figure 2:
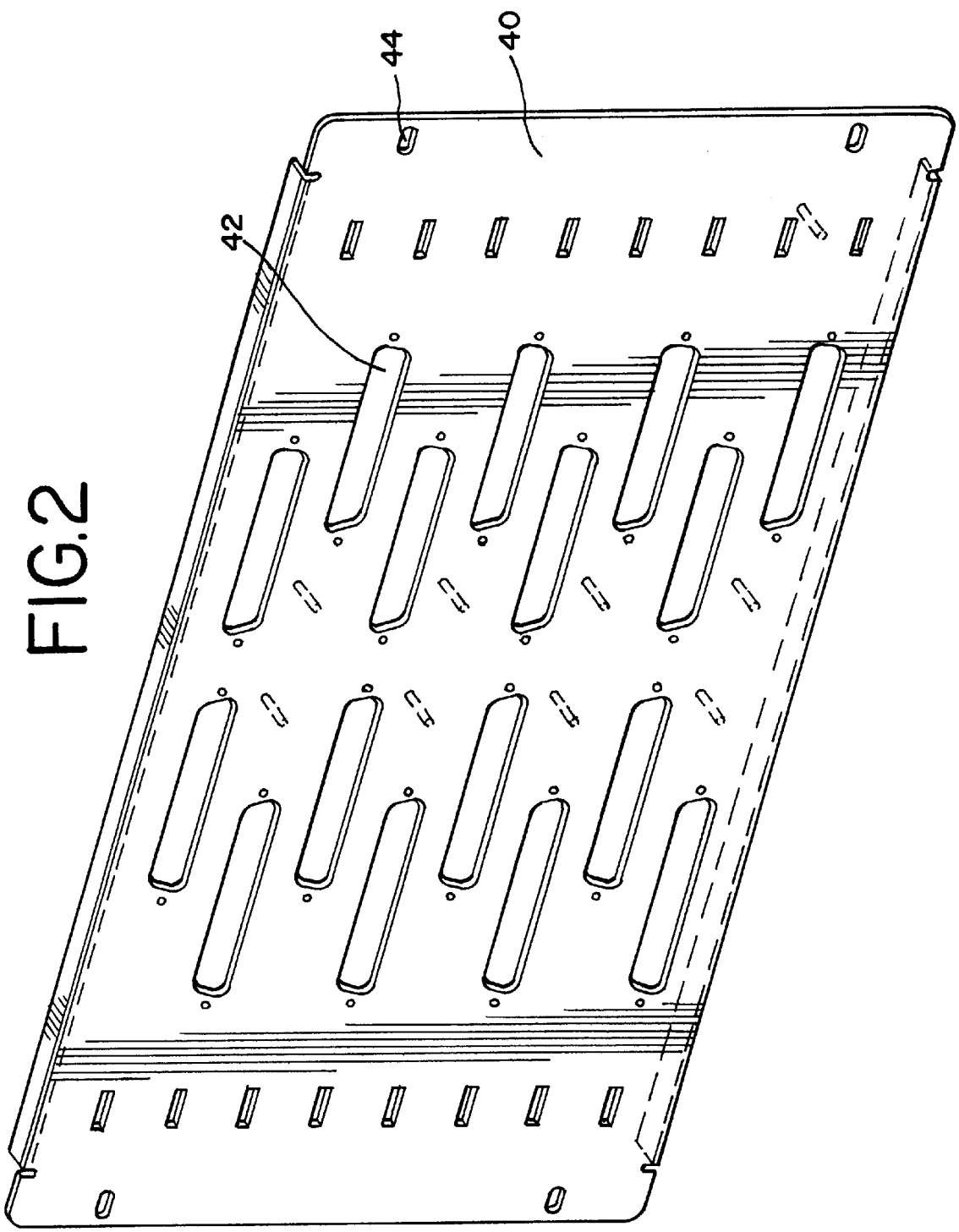
FIG. 2 is a perspective of a bracket member of the interface panel of FIG. 1.

Referring to FIG. 2, the interface panel 10 includes a bracket member 40 having a plurality of openings 42 to receive a plurality of connectors. In the embodiment shown, for example, a maximum of sixteen openings is provided. The number of openings 42 for receiving connectors may vary depending upon the number of connectors to be used and the particular application. As shown in FIG. 2 the bracket member 40 may preferably be a planer member having a generally rectangular shape. The bracket member 40 may have other shapes and configurations depending upon the particular application. The bracket member 40 may preferably be comprised from a single piece of conductive material such as, for example, steel or aluminum.

The bracket member 40 may preferably include a plurality of mounting holes 44 to allow the bracket member 40 to be fastened to the electronics cabinet 14. As shown in FIG. 4, the bracket member 40 may preferably be fastened to the rack 24 along a back portion of the electronics cabinet 14. The bracket member 40 may be fastened to the rack 24 with any conventional fastener such as, for example, screws or bolts.

Referring again to FIGS. 1 and 3–4, a plurality of connectors 46 is positioned within the plurality of openings 42. Each of the plurality of connectors 46 is mounted to the bracket member 40. In the embodiment shown, for example, sixteen connectors are provided. However, the number of connectors may vary depending upon the particular application. The plurality of connectors 46 may preferably be fastened to the bracket member 40 in any conventional manner.

Each of the plurality of connectors 46 includes at least fifteen conductive pins. In a preferred embodiment, for example, sixty-four conductive pins are provided. It should be noted, however, that the number of conductive pins may vary depending upon the size and configuration of the connector 46. The connectors 46 may be any one of the commercially available connectors having at least fifteen conductive pins.

Referring to FIG. 4, a plurality of output cables 50 is operatively connected to each of the plurality of connectors 46. The plurality of output cables 50 may preferably include eleven output cables. The plurality of output cables 50 operatively coupled to each of the plurality of connectors 46 may preferably be bundled together. As shown in FIG. 4, each of the plurality of output cables 50 may preferably be hardwired to each of the plurality of connectors 46.

In the embodiment shown, each of the plurality of output cables 50 is operatively coupled to a predetermined set comprising several of the at least fifteen conductive pins of each of the plurality of connectors 46. Each of the plurality of output cables 50 may preferably be hardwired to the predetermined set comprising several of the at least fifteen conductive pins. The predetermined set, as defined above, may preferably include at least four conductive pins of the at least fifteen conductive pins.

As shown in FIG. 1, each of the plurality of output cables 50 also include an adapter 52. The adapter 52 may preferably be a RJ48 adapter. Each of the plurality of electronic modules 12 may preferably include at least one socket 13 adapted to receive the adapter 52. As shown, each electronic module 12 includes a plurality of sockets to receive a plurality of output cables.

Referring to FIG. 3, the plurality of connectors 46 are adapted to receive a plurality of input cables 60. Each of the plurality of input cables 60 may preferably include an input connector 62 adapted to mate with the plurality of connectors 46. The input connectors 62 may be any one of the commercially available connectors adapted to mate with the plurality of connectors 46.

As shown in FIGS. 1–4, the interface panel 10 may be used to provide telecommunication signals to the plurality of electronic modules 12 housed within the electronics cabinet 14. The plurality of connectors 46 is positioned within the plurality of openings 42 of the bracket member 40 and is mounted to the bracket member 40. Each of the plurality of output cables 50 is operatively coupled to a predetermined set of the at least fifteen conductive pins of each of the plurality of connectors 46. The plurality of input cables 60 may preferably be connected to the plurality of connectors 46. The adapter 52 of each of the output cables 50 may preferably be inserted into the at least one socket 13 of one of the plurality of electronic modules 12.

One advantage of the interface panel 10 is that it provides a compact and consolidated interface between incoming input cables 60 and the electronic modules 12 mounted within the electronics cabinet 14. This in turn increases the amount of available free space in the cabinet 14 that may be used for other various electronic functions. Moreover, routing a maximum of sixteen input cables 60 to the interface panel 10 (as opposed to 176 individual cables in conventional communication panels) also saves space within the cabinet 14. Moreover, the reduced number of input cables 60 provides greater airflow through the cabinet, which reduces the chance of overheating of the various electronic modules within the cabinet.

In addition, the interface panel 10 reduces the total number of connections to the interface panel 10, which decreases installation time and also reduces the chances of the input cables 60 being improperly routed. Finally, the interface panel 10 greatly reduces the time required to debug the system in the event there is a failure in one or more of the connections.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An interface panel for providing telecommunication signals to a plurality of electronic modules housed within an electronics cabinet comprising:

a bracket member for mounting to a rack housed within the electronics cabinet, the bracket member including a plurality of openings, a plurality of connectors for receiving a plurality of input cables positioned within the plurality of openings, each of the plurality of connectors mounted to the bracket, each of the plurality of connectors including at least fifteen conductive pins, a plurality of output cables for connection to the plurality of electronic modules operatively coupled to each of the plurality of connectors, each of the plurality of output cables operatively coupled to a predetermined set comprising several of the at least fifteen conductive pins, each of the plurality of output cables including an adapter for connection to one of the plurality of electronic modules.

2. The apparatus of claim 1 wherein the at least fifteen conductive pins comprises sixty-four conductive pins.

3. The apparatus of claim 1 wherein the adapter is a RJ48 adapter.

4. The apparatus of claim 1 wherein the bracket member is a planar member.

5. The apparatus of claim 1 wherein the bracket member is comprised of a conductive material.

6. The apparatus of claim 1 wherein the plurality of output cables comprises eleven output cables.

7. The apparatus of claim 1 wherein each of the plurality of output cables is hardwired to each of the plurality of connectors.

8. The apparatus of claim 1 wherein each of the plurality of output cables is hardwired to the predetermined set of the at least fifteen conductive pins.

9. The apparatus of claim 1 wherein the predetermined set comprises at least four conductive pins.

10. The apparatus of claim 1 wherein the plurality of output cables operatively coupled to one of the plurality of connectors is bundled together.

11. The apparatus of claim 1 wherein the plurality of openings comprises sixteen openings.

12. The apparatus of claim 1 wherein the plurality of connectors comprises sixteen connectors.

13. A system for providing telecommunications signals to a plurality of electronic modules housed in an electronics cabinet comprising:

a plurality of electronic modules positioned within the electronics cabinet, an interface panel mounted to a rack housed within the electronics cabinet, the interface panel including a bracket member, the bracket member including a plurality of openings, a plurality of connectors for receiving a plurality of input cables positioned within the plurality of openings and mounted to the bracket, each of the plurality of connectors including at least fifteen conductive pins, a plurality of output cables for connection to the plurality of electronic modules operatively coupled to each of the plurality of connectors, each of the plurality of output cables operatively coupled to a predetermined set comprising several of the at least fifteen conductive pins, each of the plurality of output cables including an adapter for connection to one of the plurality of electronic modules.

14. The apparatus of claim 13 wherein the at least fifteen conductive pins comprises sixty-four conductive pins.

15. The apparatus of claim 13 wherein the adapter is a RJ48 adapter.

16. The apparatus of claim 13 further comprising a vertically oriented rack housed within the electronics cabinet, each of the plurality electronic modules fastened to the rack.

17. The apparatus of claim 16 wherein the bracket member of the interface panel is fastened to the rack along a back portion of the electronics cabinet.

18. The apparatus of claim 13 wherein the each of the plurality of input cables includes an input connector adapted to mate with the plurality of connectors.

19. The apparatus of claim 13 wherein each of the plurality of electronic modules includes at least one socket adapted to receive the adapter.

20. A method of providing telecommunication signals to a plurality of electronic modules housed within an electronics cabinet comprising:

providing a bracket member for mounting to a rack housed within the electronics cabinet, the bracket member including a plurality of openings, a plurality of connectors, each of the plurality of connectors including at least fifteen conductive pins, and a plurality of output cables for connection to the plurality of electronic modules, each of the plurality of output cables including an adapter;

positioning the plurality of connectors within the plurality of openings;

mounting the plurality of connectors to the bracket; and operatively coupling each of the plurality of output cables to a predetermined set comprising several of the at least fifteen conductive pins.

21. The method of claim 20 wherein the at least fifteen conductive pins comprises sixty four conductive pins.

22. The method of claim 20 further comprising:

providing a plurality of input cables, each of the plurality of input cables including an input connector adapted to mate with one of the plurality of connectors; and connecting the plurality of input cables to the plurality of connectors.

23. The method of claim 20 wherein each of the plurality of electronic modules includes at least one socket adapted to receive the adapter; and inserting the adapter into the at least one socket of one of the plurality of electronic modules.

* * * * *